United States Patent [19]

Pryor

[11] 4,029,971

[45] June 14, 1977

[54] TRI-STATE LOGIC CIRCUIT

[75] Inventor: Richard Lee Pryor, Voorhees, N.J.

[73] Assignee: RCA Corporation, New York, N.Y.

[22] Filed: Feb. 13, 1976

[21] Appl. No.: 657,838

[52] U.S. Cl. .............................. 307/209; 307/251; 307/270

[51] Int. Cl.² .................... H03K 1/00; H03K 19/08

[58] Field of Search .......... 307/209, 205, 270, 251, 307/255

[56] References Cited

UNITED STATES PATENTS

| | | | |
|---|---|---|---|
| 3,739,193 | 6/1973 | Pryor | 307/305 |
| 3,879,619 | 4/1975 | Pleshko | 307/305 |
| 3,906,254 | 9/1975 | Lane et al. | 307/270 |
| 3,949,242 | 4/1976 | Hirasawa et al. | 307/205 |

Primary Examiner—Stanley D. Miller, Jr.
Assistant Examiner—B. P. Davis
Attorney, Agent, or Firm—H. Christoffersen; S. Cohen

[57] ABSTRACT

A line driver including a pair of complementary transistors having their conduction paths serially connected between an operating and a reference potential and their bases connected through a first switch to a signal input terminal. A second switch is connected between the common base connection and the common connection of the conduction paths. With the second switch open and the first closed, an output voltage, responsive to the input signal, corresponding to first or second binary values is obtained. When the second switch is closed and the first opened, the transistor pair is turned off, disconnecting the line driver from its load, thereby providing tri-state logic operation.

7 Claims, 1 Drawing Figure

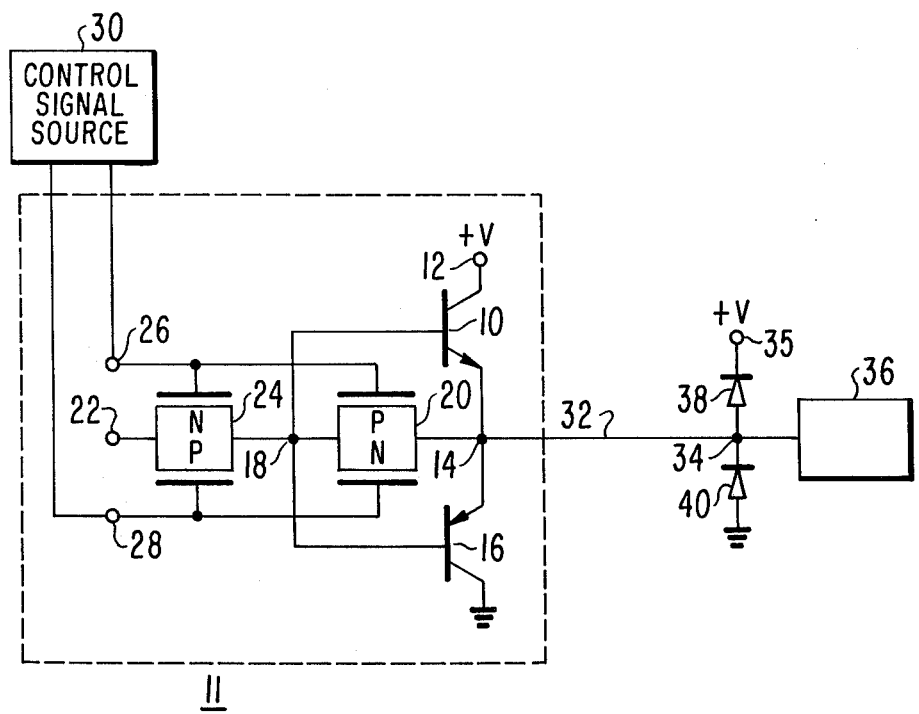

TRI-STATE LOGIC CIRCUIT

This invention described herein was made in the performance of work under NASA Contract NAS 8-29072, and is subject to the provisions of section 305 of the National Aeronautics and Space Act of 1958, (72 Stat. 435; 42 USC 2457).

A tri-state logic circuit is one that can assume one of three states. It can produce at an output terminal voltages corresponding to first and second binary values or it can cause the output terminal electrically to "float". Such circuits are useful, for example, in digital applications where it is desired to connect outputs of a number of logic circuits to a common data bus. One such use is in memory systems where the information contained in a number of storage cells is gated through a line driver to a common data bus to obtain readout of stored data. The general system rule in such memory circuits is that only one driver per bus is permitted to be turned on at any one time. The receivers associated with this bus may be on at all times, receiving the logic level of whichever tri-state driver is transmitting at that particular time.

Tri-state operation may be achieved by connecting the output of a line driver to the data bus through a metal-oxide-semiconductor (MOS) transmission gate and strobing the transmission gate to read data into the data bus. When the transmission gate is turned off, the isolated or floating condition is achieved. A high degree of isolation exists at this time between the line driver and the data bus. When turned on, the transmission gate permits the associated driver to be in either its first or second state, that is, it may be supplying current to or it may be sinking current from the bus. Both states are possible because of the bilateral nature of the transmission gate's conduction path.

While the above described technique is suitable for many applications, there can be problems if the current levels associated with the line driver circuit are relatively high. As such currents must be carried by the transmission gates, they must be relatively large. In some cases they may have to be so large that they cannot readily be fabricated, for example, in integrated circuit form.

In circuits embodying the present invention, switching means such as transmission gates are employed to switch the circuit between conditions in which it can assume the desired states, but they do not carry the driver output current. In a preferred form of the circuit in which the driver includes the serially connected conduction paths of two transistors, one switch is connected between a node at the common connection of the control electrodes and the driver output terminal and another, which is operated in complementary fashion to the first, is connected between the signal input terminal and the node.

In the drawing, the sole FIGURE shows a preferred embodiment of the invention.

In the FIGURE the collector of NPN transistor 10 is connected to terminal 12 to which an operating voltage +V is applied while its emitter is connected to output node 14. The emitter of PNP transistor 16 is connected to node 14 while its collector is connected to a reference potential, herein ground. The bases of these two transistors are interconnected at node 18. Connected between node 18 and terminal 14 is the conduction path of complementary metal-oxide-semiconductor (CMOS) transmission gate 20. Connected between node 18 and terminal 22 is the conduction path of CMOS transmission gate 24. Each transmission gate includes an NMOS and a PMOS transistor. The gates of the NMOS transistor of transmission gate 24 and the PMOS transistor of transmission gate 20 are connected to control signal input terminal 26 while the gate electrodes of the remaining transistors of the transmission gates are connected to control signal input terminal 28. The control signals applied to terminal 26 are the logical complement of those applied to terminal 28.

Output terminal 14 is coupled by transmission line 32 to input node 34 of utilization circuit 36. The anode of line terminating diode 38 is connected to terminal 34 while its cathode is connected to terminal 35 to which the operating voltage +V is applied. The cathode of line terminating diode 40 is connected to terminal 34 while its anode is connected to the reference potential. The line driver portion 11 of the circuit of the FIGURE is shown within the dashed lines.

Transmission gates 20 and 24 each provide a very high conduction path impedance when open and a relatively low impedance when closed. Each gate is closed by applying a relatively positive voltage to its NMOS transistor gate electrode and a zero or negative voltage to the gate electrode of its PMOS transistor. Opposite polarity voltage levels open the gate. It can be seen by reference to the FIGURE that when control signals are applied tending to close gate 24 the same signals cause gate 20 to be open. Thus, when one of the transmission gates is open the other is closed. They are never both open or closed at the same time.

Line driver 11 may represent one of a plurality of drivers connected to transmission line 32. This transmission line may be a twisted wire pair, coaxial cable or, if the length is relatively short, ordinary single wire. Assume initially that transmission gate 24 is closed and 20 is open. An input logic signal applied to terminal 22 is coupled to the bases of transistors 10 and 16. If this signal is relatively positive with respect to the reference potential, transistor 10 conducts. The voltage present at output node 14 is made positive upon conduction of transistor 10 and imparts a positive voltage level to the transmission line. Current is being supplied to the transmission line at this time.

If the input logic signal is less in value than the voltage at node 14, transistor switches off and transistor 16 conducts. The conduction of transistor 16 will draw current from the line and tend to drive the potential at node 14 towards the reference potential. Thus, when line driver 11 is primed by the closing of transmission gate 24 and the opening of transmission gate 20, the output voltage at this stage represents one of two logic states.

When it is desired to realize the third output state of the line driver, that is, the condition when terminal 14, if disconnected from the transmission line 32, would electrically float, transmission gate 20 is closed and at the same time gate 24 is open. The closing of transmission gate 20 effectively connects together the base and emitter electrodes of each of biopolar transistor, thereby turning them off. In the absence of line 32, this would disconnect terminal 14 from both ground and +V (in practice, the line 32 may be at one of these or some other level via some other circuit). The opening of transmission gate 24 disconnects input terminal 22 from output terminal 14 and thus insures that none of the logic signals present at input terminal 22 are fed through to terminal 14. It should be noted that at no time does the full load current flowing through line 32 flow through gates 20 or 24, thereby avoiding the shortcoming of the prior art circuit discussed in the introductory portion of this application.

Diodes 38 and 40 which are located at the receiver end of the transmission line serve as a termination for this line. Assume initially that transmission line 32 is coupled to the reference potential through transistor 16. Further assume that the input impedance of the utilization circuit 36 is very large compared to the characteristic impedance of the line 32, as for example, in the case when this impedance comprises the input impedance of an MOS transistor. Circuit 36 may represent a data receiver. For this condition, both diodes are off. A positive voltage applied to input terminal 22 turns transistor 16 off and transistor 10 on. This coupled the transmission line to a voltage at or near the opening voltage +V. This voltage propagates the length of the transmission line and when it reaches the utilization circuit 36, it is reflected. Because of the high input impedance of circuit 36, which is essentially an open circuit, the reflection coefficient is close to unity. Therefore, a voltage having a value close to 2V, representing the sum of the incident and reflected volages appears at node 34. This voltage turns on diode 38 which, in turn, clamps node 34 to the +V voltage level. This clamping action tends to remove most of the reflections from the signals on line 32. Once the reflections have died down, diode 38 turns off. Therefore, for steady state conditions no current is drawn by this termination.

In a similar manner, a negative going voltage wave propagated down the line would be reflected and have a value below the reference potential level. This turns on diode 40 thereby clamping the voltage to the reference potential level, thus removing most of the negative going reflections. As was the case for diode 38, once reflections have died down, diode 40 turns off, drawing no steady-state current.

In actual circuit operation, use of the above described diode termination resulted in generation of a reflected voltage of approximately 2 volts with a system operating voltage of 10 volts. Because there was sufficient noise immunity associated with the remaining circuit elements, these reflections did not interfere with normal system operation. Some possible reasons for the non-ideal clamping action of the terminating circuit include the non-zero turn on time of the diodes, there finite impedance when on and the diode forward voltage drop.

The above described method of terminating a transmission line results in zero standby power being consumed by the termination once transient conditions on the line died down. Such would not be the case if these diodes were replaced by, for example, resistances. While the diodes do not necessarily provide the ideal value of impedance for a line termination, a substantial reduction in power consumption may be realized especially if a large number of these circuits are utilized. Such savings in power consumption may outweigh the disadvantages associated with terminating a transmission line in other than its characteristic impedance.

In the circuit of the FIGURE the transmission gates have been realized with CMOS devices. The invention is not restricted to this particular switching element. For example, the gates 20 and 24 may each be replaced by a single MOS transistor. In addition transistors 10 and 16 may be replaced with complementary MOS devices. Diodes 38 and 40 may be replaced with other terminating means such as resistances. In that case, the advantage of no steady state power being drawn by the terminating elements would be lost.

What is claimed is:
1. An amplifying circuit comprising, in combination:
   first and second amplifiers, each amplifier having an input and an output terminal and a relatively high input impedance, said first and second amplifier input terminals interconnected and coupled to a circuit input terminal to which an input signal may be applied and said first and second amplifier output terminals interconnected and connected to a circuit output terminal;
   first switching means having an impedance when in its open state very much greater than said relatively high input impedance and when in its closed state very much less than said relatively high input impedance, said first switching means connected between the interconnected amplifier input terminals and said circuit output terminal;
   second switching means connected between said circuit input terminal and the interconnected amplifier input terminals;
   means for concurrently closing said first switching means and opening said second switching means and vice-versa;
   a transmission line connected at one end to said circuit output terminal;
   load means connected to the other end of said line, said load means causing a reflected wave to propagate through said line towards said circuit output terminal in response to said output signal when its input impedance does not equal the characteristic impedance of said line; and
   means responsive to the instantaneous sum of said output signal and said reflected wave for coupling said line to a point at a first potential whenever said sum is greater than a first predetermined value and to a second potential whenever said sum is less than a second predetermined value.
2. The combination as set forth in claim 1 wherein said means responsive to the instantaneous sum comprises first and second diodes, said first diode connected between said transmission line and said point at a first potential and said second diode connected between said transmission line and said point at a second potential.
3. The combination as set forth in claim 1 wherein said means responsive to the instantaneous sum is connected to said transmission line at its said other end.
4. The combination as set forth in claim 2 wherein said first and second amplifiers comprise bipolar transistors of first and second conductivity types, each having a base, an emitter and a collector electrode, said input and output terminal of each amplifier comprising the respective base and emitter electrodes of each transistor.
5. In a tri-state logic circuit comprising, in combination:
   first and second transistors of complementary conductivity types, each of said first and second transistors having respective first and second electrodes with a controlled conduction path therebetween and a respective control electrode, the conduction of the controlled conduction path of each of the first and second transistors being controlled responsive to the potential applied between its first and control electrodes;

a circuit input terminal;

means connecting said first and second transistors in complementary potential follower configuration including a node connected to both control electrodes, a circuit output terminal to which the first electrodes of said first and said second transistors are each connected, and first and second power supply terminals, for receiving an operating potential therebetween, to which the second electrodes of said first and said second transistors are respectively connected;

first switch means for connecting and disconnecting said dircuit input terminal to and from said node; and second switch means operative concurrently with said first switch means for connecting said node to said output terminal, thereby turning both transistors off, when said first switch means disconnects said circuit input terminal from said node and for disconnecting said node from said output terminal when said first switch means connects said circuit input terminal to said node.

6. In the combination as set forth in claim 5, said first and second switch means comprising first and second metal oxide semiconductor transmission gates and means for operating them in complementary fashion.

7. In the combination as set forth in claim 5, said transistors comprising bipolar transistors of opposite conductivity type, each transistor having base, emitter and collector electrodes corresponding to said control and said first and second electrodes, respectively.

* * * * *

UNITED STATES PATENT OFFICE
CERTIFICATE OF CORRECTION

PATENT NO. : 4,029,971

DATED : June 14, 1977

INVENTOR(S) : Richard Lee Pryor

It is certified that error appears in the above-identified patent and that said Letters Patent are hereby corrected as shown below:

Column 2, line 47, before "switches" insert -- 10 --.
Column 3, line 19, change "opening" to -- operating --.
Column 4, line 60, cancel "In"; change "a" to -- A --.
Column 5, line 17, change "dircuit" to -- circuit --.

Signed and Sealed this

First Day of November 1977

[SEAL]

Attest:

RUTH C. MASON
*Attesting Officer*

LUTRELLE F. PARKER
*Acting Commissioner of Patents and Trademarks*